United States Patent
Sato (10) Patent No.: US 7,477,001 B2
(45) Date of Patent: Jan. 13, 2009

(54) PIEZOELECTRIC RESONATOR ELEMENT AND METHOD OF MANUFACTURING SAME

(75) Inventor: Kei Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 227 days.

(21) Appl. No.: 11/386,244

(22) Filed: Mar. 21, 2006

(65) Prior Publication Data

US 2006/0214539 A1  Sep. 28, 2006

(30) Foreign Application Priority Data

Mar. 24, 2005  (JP) ............................. P2005-085607

(51) Int. Cl.
*B41J 2/045* (2006.01)
*H01L 41/04* (2006.01)

(52) U.S. Cl. .................. 310/320; 310/358; 310/365

(58) Field of Classification Search ............... 310/358, 310/320, 365
See application file for complete search history.

(56) References Cited

U.S. PATENT DOCUMENTS

2003/0119220 A1*  6/2003  Mlcak et al. ................ 438/52
2005/0130360 A1*  6/2005  Zhan et al. ................. 438/197
2005/0142888 A1*  6/2005  Ebuchi et al. ............... 438/738
2005/0236710 A1*  10/2005  Akiyama et al. ............ 257/744
2006/0131680 A1*  6/2006  Akiyama et al. ............ 257/416
2006/0165994 A1*  7/2006  Dalakos et al. ............. 428/408

FOREIGN PATENT DOCUMENTS

| JP | 62214167 A | * | 9/1987 |
| JP | 0010290247 | | 10/1998 |
| JP | 2001312699 | | 11/2001 |
| JP | 2002315066 | | 10/2002 |

OTHER PUBLICATIONS

K.M. Lakin, "Thin Film Resonators and Filters," Proceedings of the 1999 IEEE Ultrasoncis Symposium, (USA), vol. 2, pp. 895-906.

* cited by examiner

*Primary Examiner*—Jaydi A San Martin
(74) *Attorney, Agent, or Firm*—Bell, Boyd & Lloyd LLP (57) ABSTRACT

A piezoelectric resonator element and method of manufacturing same are provided. The piezoelectric resonator element having a lower electrode, a piezoelectric substance layer, and an upper electrode disposed in this order on a substrate with an air layer between the substrate and the lower electrode, and having a laminated structure of the lower electrode, the piezoelectric substance layer, and the upper electrode in at least a part of the piezoelectric resonator element, wherein internal stress of the piezoelectric substance layer is −300 MPa to 90 MPa.

3 Claims, 6 Drawing Sheets

FIG. 7B

PIEZOELECTRIC RESONATOR ELEMENT AND METHOD OF MANUFACTURING SAME

CROSS REFERENCES TO RELATED APPLICATIONS

The present application claims priority to Japanese Patent Application JP 2005-085607 filed in the Japanese Patent Office on Mar. 24, 2005, the entire contents of which being incorporated herein by reference.

BACKGROUND

The present invention relates to a piezoelectric resonator element and a method of manufacturing the same, and particularly to a method of manufacturing a thin film bulk acoustic resonator (hereinafter described as an FBAR) using an electroacoustic effect exhibited by a piezoelectric substance layer, and the FBAR.

Recently, with higher functionality and higher speed of portable telephones and PDA devices, there has been a stronger desire than ever for reductions in size and cost of high-frequency filters operating at a few hundred MHz to a few GHz which filters are included in the communication devices. A strong candidate for a high-frequency filter meeting this desire is a filter using an FBAR that can be formed by using semiconductor manufacturing technology.

Figure 6A:
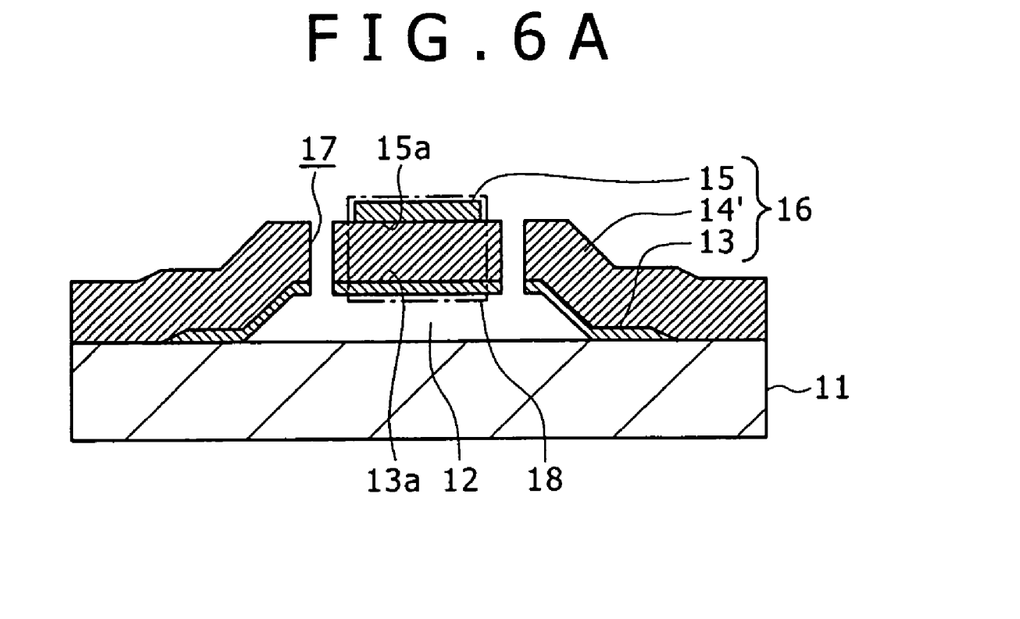
FIGS. 6A and 6B are a sectional view and a plan view, respectively, of assistance in explaining a conventional piezoelectric resonator element.
Figure 6B:
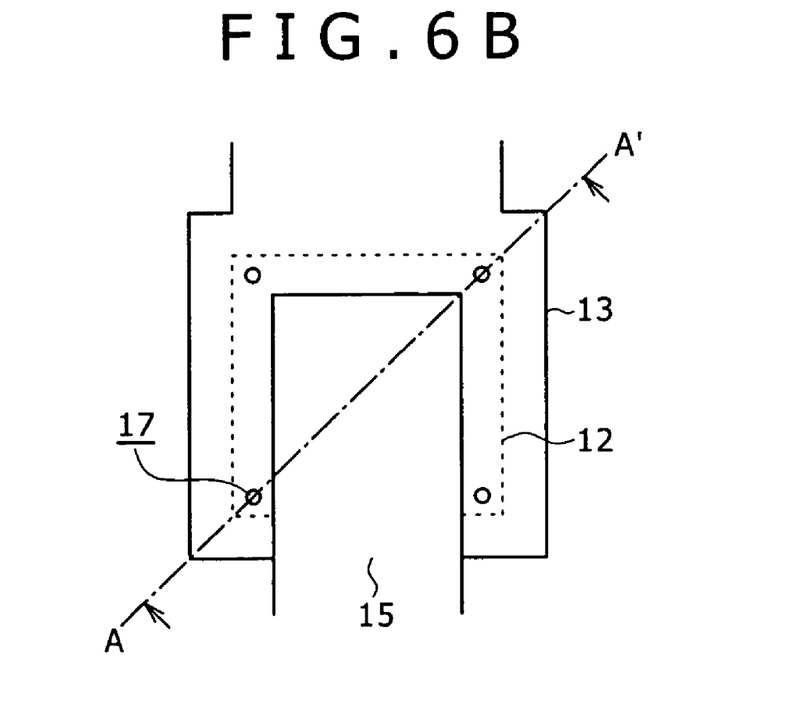

FIGS. 6A and 6B show an example of a structure referred to as an air bridge type as a typical example of the FBAR (see for example, K. M. Lakin, "Thin film resonator and filters", Proceedings of the 1999 IEEE Ultrasonics Symposium, (USA), Vol. 2, pp. 895-906 (hereinafter referred to as Non-Patent Document 1)). FIG. 6A is a sectional view. FIG. 6B is a plan view. FIG. 6A is a sectional view taken along a line A-A' of FIG. 6B.

As shown in FIG. 6A, a structure 16 formed by sequentially forming a lower electrode 13, a piezoelectric substance layer 14', and an upper electrode 15 is provided on a substrate 11 formed of high-resistance silicon or high-resistance gallium arsenide with an air layer 12 between the structure 16 and the substrate 11.

The lower electrode 13 is provided in a state of closing the air layer 12 and in a state of being extended in one direction on the substrate 11 (see FIG. 6B). The piezoelectric substance layer 14' is provided over the substrate 11 in a state of covering the lower electrode 13. Further, the upper electrode 15 is provided in a state of at least a part of the upper electrode 15 being laminated on the lower electrode 13 over the air layer 12 with the piezoelectric substance layer 14' between the upper electrode 15 and the lower electrode 13. This upper electrode 15 is extended in an opposite direction from the lower electrode 13, and is provided with a narrower width than the lower electrode 13 (see FIG. 6B).

A plurality of hole parts 17 in a state of reaching the air layer 12 are provided in the piezoelectric substance layer 14' and the lower electrode 13 in an area outside the upper electrode 15. The air layer 12 communicates with an air outside the structure 16 via only the hole parts 17.

A part formed by laminating the lower electrode 13, the piezoelectric substance layer 14', and the upper electrode 15 forms a vibrating part 18 of the FBAR. The lower electrode 13 is thus provided in contact with the air layer 12. Therefore, as with the upper electrode 15, the lower electrode 13 is formed with a boundary surface in contact with the air. Since the FBAR formed as described above has the vibrating part 18 provided above the substrate 11 with the air layer 12 between the substrate 11 and the vibrating part 18, the FBAR is easily mounted in such a manner as to be mixed with a compound monolithic microwave integrated circuit (compound MMIC) or a silicon IC. This feature suits needs for smaller size and higher functionality in the market.

Operation of the FBAR will be described in the following. When a temporally changing electric field is produced within the piezoelectric substance layer 14' by applying an alternating voltage between the upper electrode 15 and the lower electrode 13, the piezoelectric substance layer 14' converts a part of electric energy into mechanical energy in the form of an elastic wave (hereinafter described as a sound wave). This mechanical energy is propagated in a direction of film thickness of the piezoelectric substance layer 14', which direction is a direction perpendicular to an upper electrode surface 15a and a lower electrode surface 13a, and is reconverted into electric energy. There is a specific frequency at which excellent efficiency is obtained in the electric energy/mechanical energy conversion process. When an alternating voltage having this frequency is applied, the FBAR exhibits a very low impedance.

This specific frequency is generally referred to as resonance frequency $\gamma$. Ignoring the presence of the upper electrode 15 and the lower electrode 13, the value of the resonance frequency $\gamma$ is given by $\gamma=V/(2t)$ as a first approximation, where V is the velocity of a sound wave in the piezoelectric substance layer 14', and t is the thickness of the piezoelectric substance layer 14'. Letting $\lambda$ be the wavelength of the sound wave, a relational equation $V=\gamma\lambda$ holds, and hence $t=\lambda/2$. This means that the sound wave induced in the piezoelectric substance layer 14' repeatedly reflects upward and downward between a boundary surface between the piezoelectric substance layer 14' and the upper electrode 15 and a boundary surface between the piezoelectric substance layer 14' and the lower electrode 13, and that a standing wave corresponding to half the wavelength of the sound wave is formed. In other words, the resonance frequency $\gamma$ is obtained when the frequency of the sound wave causing the standing wave of half the wavelength of the sound wave and the frequency of the externally applied alternating voltage coincide with each other.

As an electronic device utilizing the very low impedance of the FBAR at the resonance frequency $\gamma$, a band-pass filter that has a plurality of FBARs combined into a ladder configuration and passes only an electric signal in a desired frequency band with a low loss is disclosed in the above-mentioned Non-Patent Document 1. In order to set a wider frequency passband in the band-pass filter, it is necessary to increase a difference between the resonance frequency $\gamma$ of the FBAR and half of the resonance frequency. As means for this, there is a method of allowing each atom forming the piezoelectric substance layer 14' to be moved by an external electric field more easily by applying a tensile stress to the piezoelectric substance layer 14'.

Such an FBAR is manufactured as follows. First, a sacrifice layer (not shown in the figure) is pattern-formed into a desired form on a substrate 11. Next, a lower electrode 13 is pattern-formed on the substrate 11 in a state of covering the sacrifice layer and extending in one direction. Next, a piezoelectric substance layer 14' is formed on the substrate 11 in a state of covering the lower electrode 13. At this time, a tensile stress is applied to the piezoelectric substance layer 14' by adjusting film-forming conditions.

Next, an upper electrode 15 is pattern-formed on the piezoelectric substance layer 14' over the sacrifice layer in a state of extending in an opposite direction from the lower electrode 13. Then, hole parts 17 reaching the sacrifice layer are formed in the piezoelectric substance layer 14' and the lower electrode 13 in an area outside the upper electrode 15. Thereafter an air layer 12 is formed by removing the sacrifice layer by wet etching that introduces an etchant from the hole parts 17.

SUMMARY

Figure 7A:
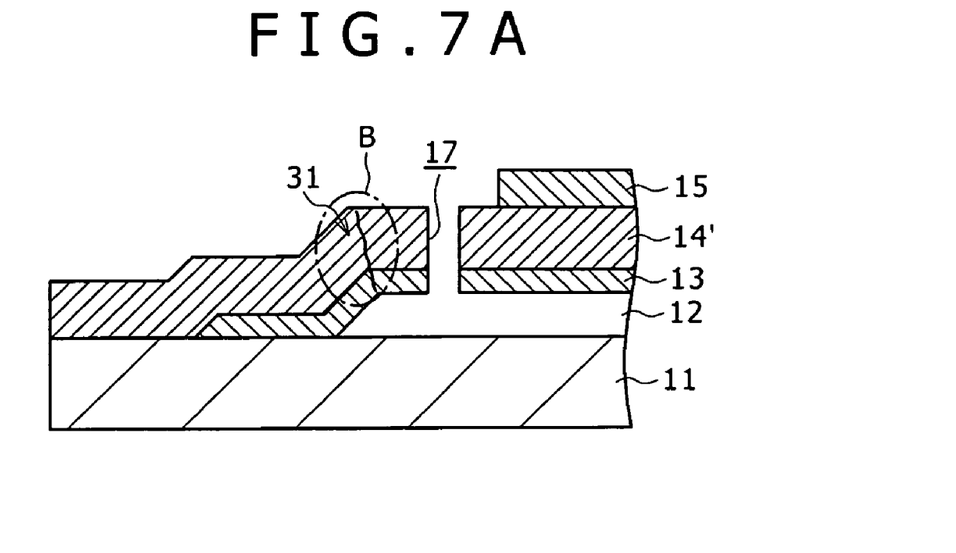
FIGS. 7A and 7B are a sectional view and a plan view, respectively, of assistance in explaining a problem concerning the conventional piezoelectric resonator element.
Figure 7B:
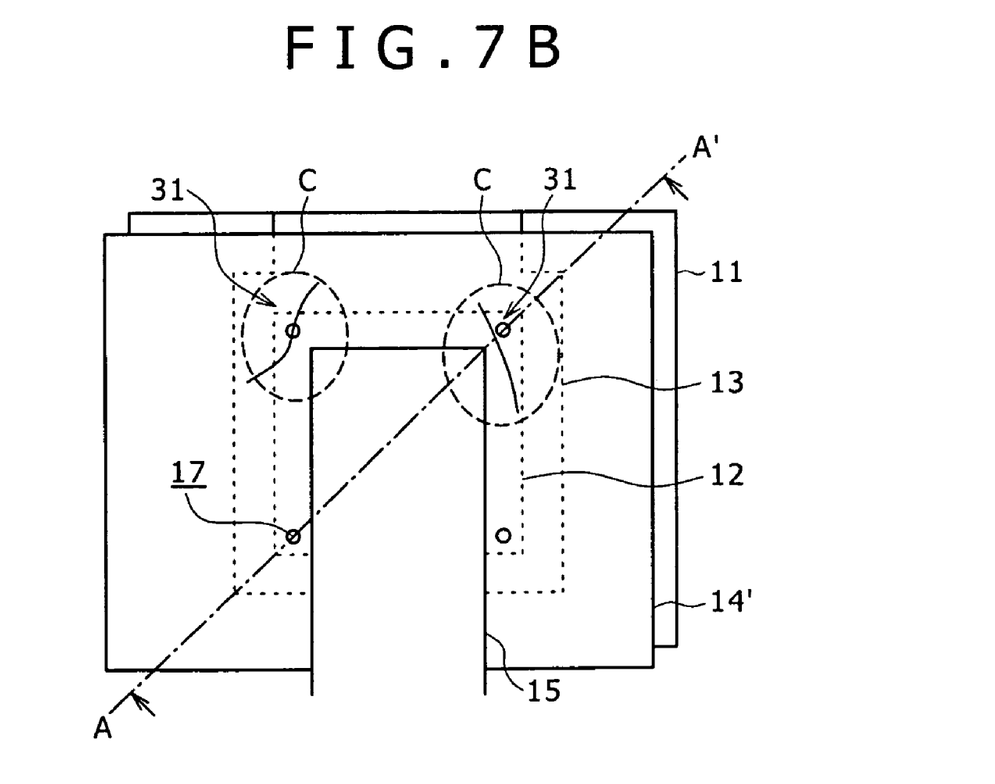

However, when the air layer is formed by removing the sacrifice layer with an excessive tensile stress present within the piezoelectric substance layer 14', a crack 31 tends to occur in the piezoelectric substance layer 14', starting from a bend part B of the piezoelectric substance layer 14' as shown in a sectional view of FIG. 7A or peripheral edges C of the hole parts 17 as shown in a plan view of FIG. 7B (FIG. 7A is an enlarged view of a section A-A' of FIG. 7B). For example, in a case of an FBAR having a piezoelectric substance layer 14' formed by an AlN film with a film thickness of 1 μm with a tensile stress of 200 MPa present within the piezoelectric substance layer 14', a rate of occurrence of the crack 31 is high at 70%.

Such a crack 31 occurring in the piezoelectric substance layer 14' greatly degrades the mechanical strength of the FBAR. In addition, when the crack 31 reaches the piezoelectric substance layer 14' directly under the upper electrode 15 forming the vibrating part 18 and an adjacently provided FBAR, not only electrical characteristics of the FBAR but also electrical characteristics of a filter using the FBAR are greatly degraded. Therefore the yields of the FBAR and the filter are decreased.

It is desirable to prevent a crack in a piezoelectric substance layer in a piezoelectric resonator element and a method of manufacturing the same.

According to an embodiment of the present invention, there is provided a piezoelectric resonator element having a lower electrode, a piezoelectric substance layer, and an upper electrode disposed in this order on a substrate with an air layer between the substrate and the lower electrode, and having a laminated structure of the lower electrode, the piezoelectric substance layer, and the upper electrode in at least a part of the piezoelectric resonator element, wherein internal stress of the piezoelectric substance layer is −300 MPa to 90 MPa.

In the present invention, compressive stress is denoted by a minus (−), and tensile stress is denoted by a plus (+). According to such a piezoelectric resonator element, by defining a range of the internal stress of the piezoelectric substance layer as a range of −300 MPa to 90 MPa, a crack in the piezoelectric substance layer due to the internal stress is prevented.

In a method of manufacturing a piezoelectric resonator element according to the present invention, the following steps are sequentially performed. In a first step, a sacrifice layer is pattern-formed on a substrate. In a second step, a lower electrode is formed over the substrate in a state of covering at least a part of the sacrifice layer. In a third step, a piezoelectric substance layer is formed over the substrate in a state of covering the lower electrode. In a fourth step, an upper electrode is formed on the piezoelectric substance layer in a state of at least a part of the upper electrode being laminated above the lower electrode over the sacrifice layer. In a subsequent step, an air layer is formed under a laminated structure of the lower electrode, the piezoelectric substance layer, and the upper electrode by removing the sacrifice layer. In the third step, the piezoelectric substance layer is formed such that internal stress of the piezoelectric substance layer is −300 MPa to 90 MPa by using a sputtering method, and adjusting pressure of a processing atmosphere and a sputtering power.

According to the method of manufacturing such a piezoelectric resonator element, the piezoelectric substance layer having an internal stress of −300 MPa to 90 MPa is formed by using the sputtering method and adjusting the pressure of the processing atmosphere and the sputtering power. Thus, the piezoelectric resonator element that prevents a crack in the piezoelectric substance layer due to the internal stress is manufactured.

As described above, according to the piezoelectric resonator element and the method of manufacturing the same according to the embodiments of the present invention, a crack in the piezoelectric substance layer is prevented, and therefore the yield of the piezoelectric resonator element can be improved.

Additional features and advantages are described herein, and will be apparent from, the following Detailed Description and the figures.

DETAILED DESCRIPTION

An embodiment of a piezoelectric resonator element according to the present invention will hereinafter be described in detail.

Figure 1A:
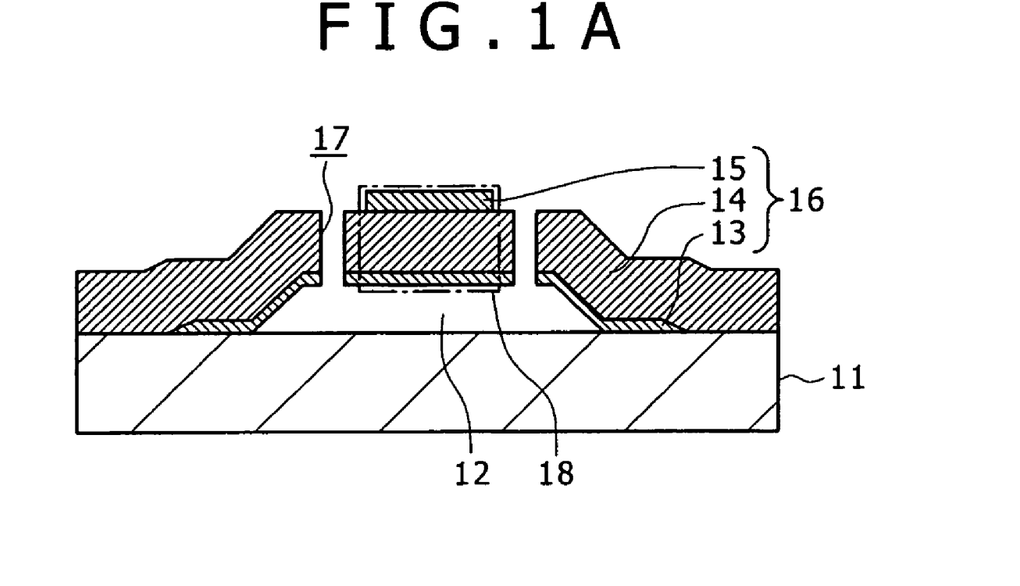
FIGS. 1A and 1B are a sectional view and a plan view, respectively, of assistance in explaining an embodiment of a piezoelectric resonator element according to the present invention.
Figure 1B:
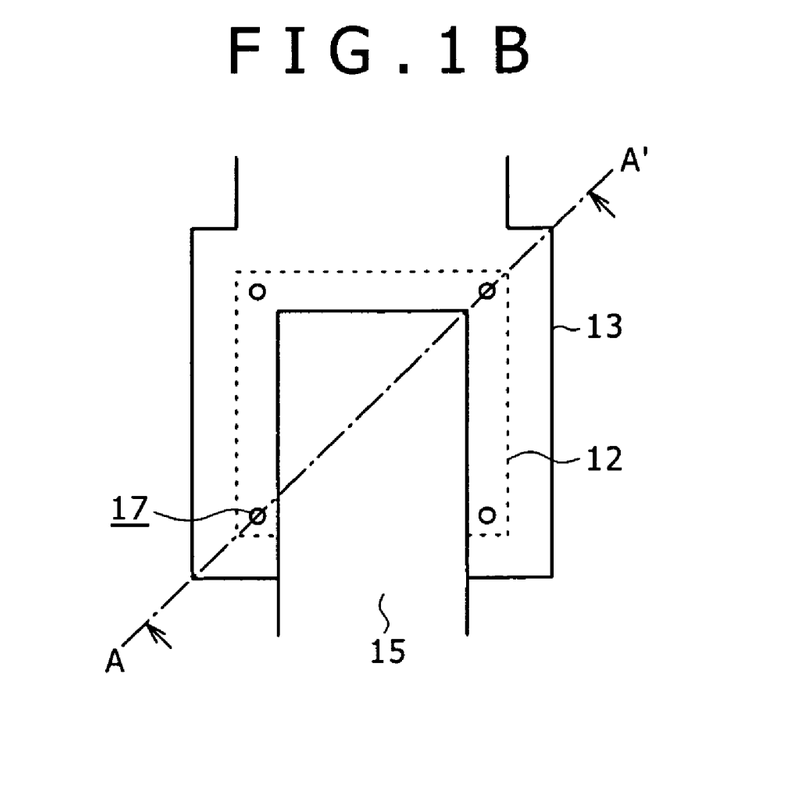

Description will be made of a first embodiment of a first piezoelectric resonator element according to the present invention, using an example of an FBAR having a frequency passband of 2 GHz. FIG. 1A is a sectional view. FIG. 1B is a plan view. FIG. 1A is a sectional view taken along a line A-A' of FIG. 1B. Incidentally, similar components to those described in the background art are identified by the same reference numerals for description.

As shown in FIG. 1A, a structure 16 formed by sequentially forming a lower electrode 13, a piezoelectric substance layer 14, and an upper electrode 15 is provided on a substrate 11 formed of high-resistance silicon or high-resistance gallium arsenide with an air layer 12 between the structure 16 and the substrate 11.

The lower electrode 13 is provided with a film thickness of 0.1 μm to 0.5 μm so as to cover the air layer 12 in a state of closing the air layer 12, and so as to be extended in one direction on the substrate 11 (see FIG. 1B). Electrode materials for forming the lower electrode 13 include molybdenum (Mo), tantalum (Ta), titanium (Ti), platinum (Pt), ruthenium (Ru), gold (Au), aluminum (Al) and the like. Suppose in this case that the lower electrode 13 is for example formed by Mo with a film thickness of 0.23 µm. Incidentally, while description below will be made of an example in which the lower electrode 13 is provided in a state of closing the air layer 12, the lower electrode 13 may be provided in a state of covering a part of the air layer 12.

The piezoelectric substance layer 14 is provided with a film thickness of 1 µm to 2 µm over the substrate 11 in a state of covering the lower electrode 13. Piezoelectric substance materials for forming the piezoelectric substance layer 14 include aluminium nitride (AlN), zinc oxide (ZnO), cadmium sulfide (CdS), lead zirconate titanate (PZT) and the like. Suppose in this case that the piezoelectric substance layer 14 is for example formed by AlN with a film thickness of 1.2 µm.

As a characteristic constitution of the present invention, the piezoelectric substance layer 14 is formed so as to have an internal stress of –300 MPa to 90 MPa. Specifically, the piezoelectric substance layer 14 in an area outside the upper electrode 15 to be described later has an internal stress in the above range. This prevents a crack in the piezoelectric substance layer 14 due to the internal stress. In the present invention, compressive stress is denoted by a minus (–), and tensile stress is denoted by a plus (+). Since compressive stress has a wider allowable range for crack prevention, it is desirable that compressive stress be present in the piezoelectric substance layer 14.

As will be described later, the internal stress of the piezoelectric substance layer 14 can be controlled by adjusting film-forming conditions for the piezoelectric substance layer 14. This internal stress is determined by an amount of warpage of the substrate 11 which warpage occurs when the piezoelectric substance layer 14 is deposited on the substrate 11 in a state of covering the lower electrode 13. The internal stress can also be determined by measuring a change of increase or decrease in distance between crystal lattice planes by an X-ray diffraction method.

The upper electrode 15 is provided with a film thickness of 0.1 µm to 0.5 µm in a state of at least a part of the upper electrode 15 being laminated on the lower electrode 13 over the air layer 12 with the piezoelectric substance layer 14 between the upper electrode 15 and the lower electrode 13. As with the lower electrode 13, Mo, Ta, Ti, Pt, Ru, Au, Al and the like can be used as electrode material for forming the upper electrode 15. Suppose in this case that the upper electrode 15 is for example formed by Mo with a film thickness of 0.29 µm.

A plurality of hole parts 17 in a state of reaching the air layer 12 are provided in the piezoelectric substance layer 14 and the lower electrode 13 in the area outside the upper electrode 15. The hole parts 17 are provided to introduce an etchant for removing a sacrifice layer (not shown) provided between the substrate 11 and the lower electrode 13 by etching and thereby forming the air layer 12. The air layer 12 communicates with an air outside the structure 16 via only the hole parts 17.

A part formed by laminating the lower electrode 13, the piezoelectric substance layer 14, and the upper electrode 15 forms a vibrating part 18 that operates as an acoustic resonator. A spacing between the substrate 11 and the lower electrode 13 provided on the substrate 11 with the air layer 12 between the lower electrode 13 and the substrate 11 is 0.5 µm to 3 µm.

The FBAR formed as described above maintains an electromechanical coupling factor and a Q value as index for evaluation of piezoelectric characteristics at a high level without greatly decreasing the electromechanical coupling factor and the Q value.

Figure 2A:
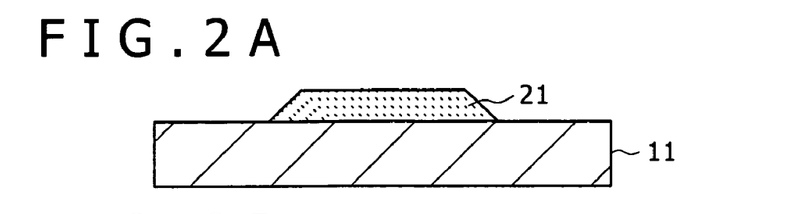
FIGS. 2A, 2B, 2C, 2D, and 2E are manufacturing process sectional views of assistance in explaining a method of manufacturing the embodiment of the piezoelectric resonator element according to the present invention.

A method of manufacturing such an FBAR will next be described with reference to FIG. 2. First, as shown in FIG. 2A, a sacrifice layer 21 is formed on a substrate 11 by forming for example an SOG (Spin On Glass) film with a film thickness of 0.5 µm to 3 µm and patterning the SOG film into a desired shape. A volume occupied by the sacrifice layer 21 is the volume of an air layer formed by etching removal in a subsequent process. Incidentally, while the sacrifice layer 21 is formed by an SOG film in this case, the sacrifice layer 21 is not limited to this, and may be formed by a silicon oxide film, a PSG (Phospho Silicate Glass) film, or a BPSG (Borophospho Silicate Glass) film.

Figure 2B:
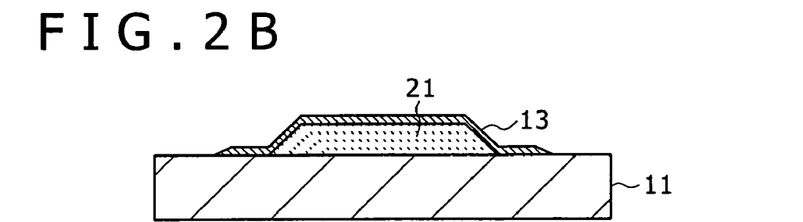

Next, as shown in FIG. 2B, Mo, for example, is deposited with a film thickness of 0.23 µm on the substrate 11 by a DC magnetron sputtering method, for example, in a state of covering the sacrifice layer 21. Next, the Mo is patterned into such a shape as to cover the sacrifice layer 21 and extend in one direction by ordinary lithography technology, whereby a lower electrode 13 is formed.

Figure 2C:
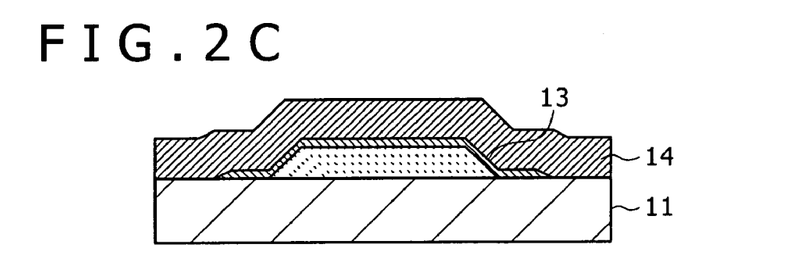

Next, as shown in FIG. 2C, a piezoelectric substance layer 14 is formed by depositing for example AlN with a film thickness of 1.2 µm over the entire area of the substrate 11 in a state of covering the lower electrode 13 by a DC pulse sputtering method, for example. At this time, as film-forming conditions, the pressure of a processing atmosphere is adjusted to about 0.27 Pa, a flow ratio between an argon gas and a nitrogen gas is adjusted to 1:7, a sputtering power is adjusted to 5 kW to 10 kW, and substrate bias voltage is adjusted to 32 V to 40 V. The internal stress of the piezoelectric substance layer 14 can be controlled by adjusting the pressure of the processing atmosphere and the sputtering power among the above film-forming conditions. The internal stress of the piezoelectric substance layer 14 can be made to be –300 MPa to 90 MPa by setting the pressure of the processing atmosphere and the sputtering power in the above ranges.

In order to obtain sufficient piezoelectric characteristics, it is necessary to orient the piezoelectric substance layer 14 in the direction of a normal to the substrate 11 as much as possible by adjusting the flow ratio between the argon gas and the nitrogen gas and the sputtering power among the above film-forming conditions. It is desirable that a half-width in the direction of the normal be within three degrees.

Figure 2D:
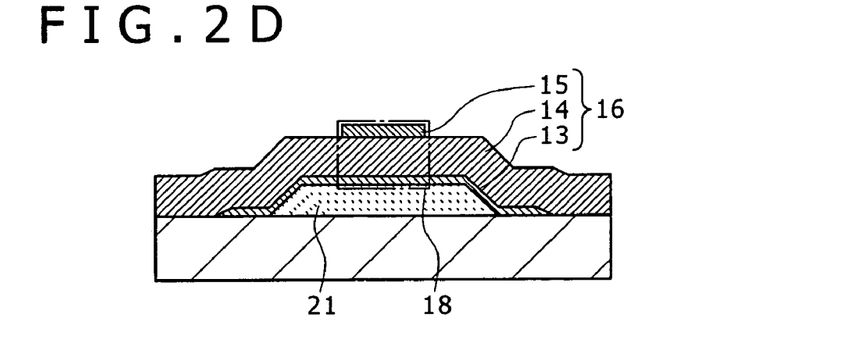

Next, as shown in FIG. 2D, Mo, for example, is deposited with a film thickness of 0.29 µm on the piezoelectric substance layer 14 by the DC magnetron sputtering method. Next, the Mo is patterned into such a shape as to be laminated above the lower electrode 13 over the sacrifice layer 21 and extend in a direction opposite to that of the lower electrode 13 by the ordinary lithography technology, whereby an upper electrode 15 is formed. Thereby, a structure 16 including the lower electrode 13, the piezoelectric substance layer 14, and the upper electrode 15 is formed, and the part formed by laminating the lower electrode 13, the piezoelectric substance layer 14, and the upper electrode 15 forms a vibrating part 18 of the FBAR being manufactured.

Figure 2E:
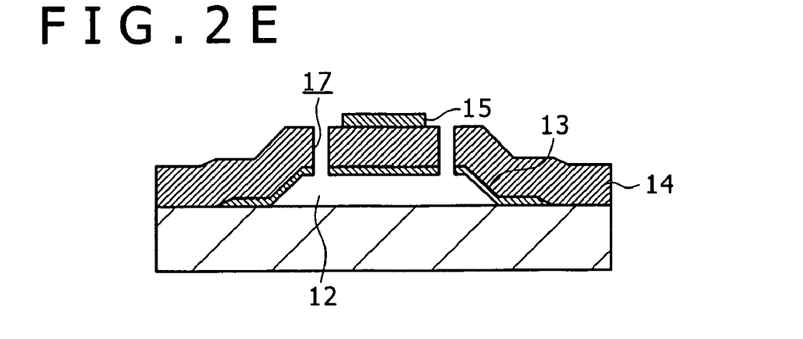

Thereafter, as shown in FIG. 2E, a resist pattern (not shown) having an opening on the piezoelectric substance layer 14 over the sacrifice layer 21 (see FIG. 2D) is formed on the upper electrode 15 and the piezoelectric substance layer 14. Then, hole parts 17 reaching the sacrifice layer 21 are formed in the piezoelectric substance layer 14 and the lower electrode 13 by etching using the resist pattern. The resist pattern is thereafter removed. Next, the sacrifice layer 21 is removed by wet etching in which a hydrogen fluoride (HF) solution, for example, is provided via the hole parts 17, whereby an air layer 12 is formed. Incidentally, while the sacrifice layer 21 is removed by wet etching in this case, the sacrifice layer 21 may be removed by dry etching using an HF-base gas.

Thus, the lower electrode 13, the piezoelectric substance layer 14, and the upper electrode 15 are provided in this order on the substrate 11 with the air layer 12 between the substrate 11 and the lower electrode 13, and the FBAR having a laminated structure of the lower electrode 13, the piezoelectric substance layer 14, and the upper electrode 15 is formed. The obtained FBAR provides a semiconductor device that does not greatly decrease an electromechanical coupling factor and maintains a high Q value.

Such an FBAR and a method of manufacturing the same can set the internal stress of the piezoelectric substance layer 14 to −300 MPa to 90 MPa, and therefore prevent a crack in the piezoelectric substance layer 14 due to the internal stress. In addition, the electromechanical coupling factor and the Q value as index for evaluation of piezoelectric characteristics can be maintained at a high level. It is therefore possible to widen the frequency passband of the FBAR and a band-pass filter using the FBAR, reduce an insertion loss, and improve a yield.

Embodiment examples of the above-described embodiment will be described concretely.

A plurality of FBARs according to each of the first to tenth examples pursuant to various embodiments in which the internal stress of a piezoelectric substance layer 14 was varied in a range of −300 MPa to 90 MPa by the same method as in the embodiment as shown in FIGS. 1A and 1B were manufactured. Table 1 shows the internal stress of the piezoelectric substance layer 14 in each manufactured FBAR. Incidentally, the internal stress of the piezoelectric substance layer 14 was measured by an amount of warpage of a substrate 11 which warpage occurred when the piezoelectric substance layer 14 formed by an AlN film was formed on the substrate 11 with a lower electrode 13 provided.

TABLE 1

|  | First Example | Second Example | Third Example | Fourth Example | Fifth Example |
|---|---|---|---|---|---|
| Internal Stress (MPa) | −300 | −250 | −200 | −150 | −100 |

|  | Sixth Example | Seventh Example | Eighth Example | Ninth Example | Tenth Example |
|---|---|---|---|---|---|
| Internal Stress (MPa) | −80 | −50 | −20 | 50 | 90 |

COMPARATIVE EXAMPLES

In addition, as examples for comparison with the above examples, a plurality of FBARs according to each of the first to seventh comparative examples in which the internal stress of a piezoelectric substance layer 14 was varied outside the range of −300 MPa to 90 MPa were manufactured. Table 2 shows the internal stress of the piezoelectric substance layer 14 in each FBAR. Incidentally, the internal stress of the piezoelectric substance layer 14 was measured by the same method as in the examples.

Figure 3:
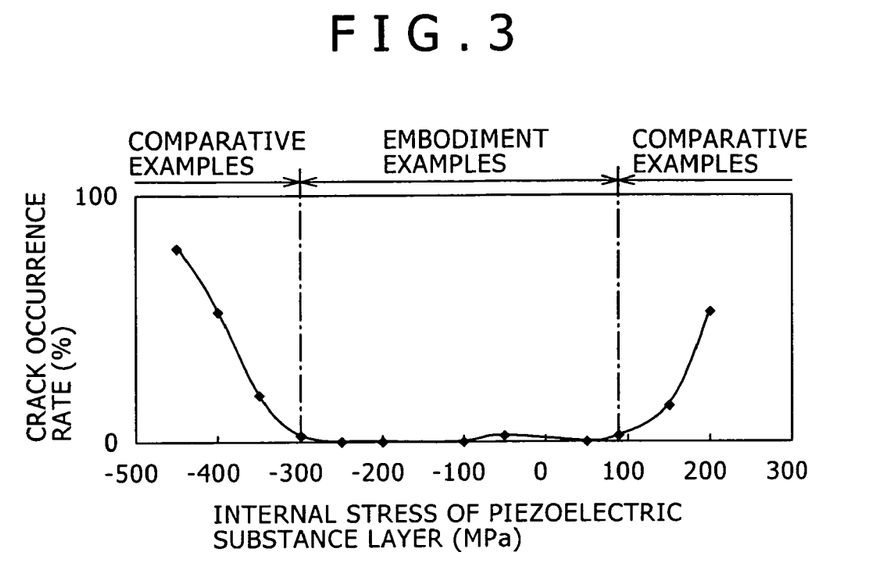
FIG. 3 is a graph showing relation between internal stresses and crack occurrence rates of embodiment examples of the piezoelectric resonator element according to the present invention and comparative examples.

FIG. 3 is a graph regarding the FBARs according to the first, second, third, fifth, seventh, ninth and tenth examples and the first, second, third, fifth, and sixth comparative examples described above, with the internal stress of the piezoelectric substance layer 14 indicated by an axis of abscissas and a crack occurrence rate indicated by an axis of ordinates. As is indicated by the graph, it is confirmed that a crack hardly occurs in the FBARs according to the embodiment examples in which the internal stress of the piezoelectric substance layer 14 is −300 MPa to 90 MPa. On the other hand, it is confirmed that the FBARs according to the comparative examples in which the internal stress of the piezoelectric substance layer 14 is outside the above range have a high crack occurrence rate.

Figure 4:
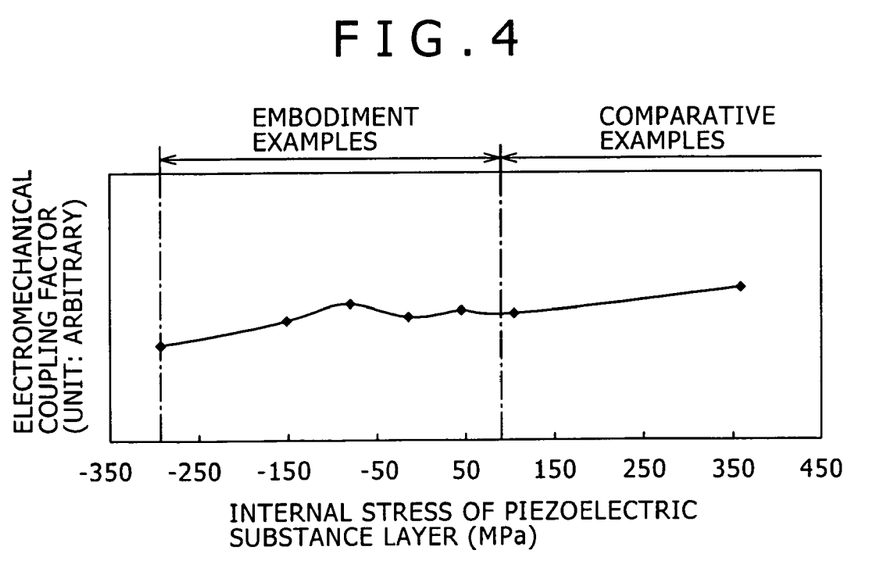
FIG. 4 is a graph showing relation between internal stresses and electromechanical coupling factors of embodiment examples of the piezoelectric resonator element according to the present invention and comparative examples.

The electromechanical coupling factors of the FBARs according to the first, fourth, sixth, eighth, and ninth examples and the fourth and seventh comparative examples described above were measured. The electromechanical coupling factor was measured using the FBARs in which the capacitance of the piezoelectric substance layer 14 in a vibrating part 18 was 3.8 pF. A graph of FIG. 4 shows relation between the internal stress and the electromechanical coupling factor with an axis of abscissas indicating the internal stress of the piezoelectric substance layer 14 and an axis of ordinates indicating the electromechanical coupling factor. As is shown in this graph, the electromechanical coupling factor tends to increase as the internal stress makes a transition from compressive stress to tensile stress. It is confirmed, however, that the FBARs according to the examples do not significantly decrease the electromechanical coupling factor as compared with the FBARs according to the comparative examples.

Figure 5:
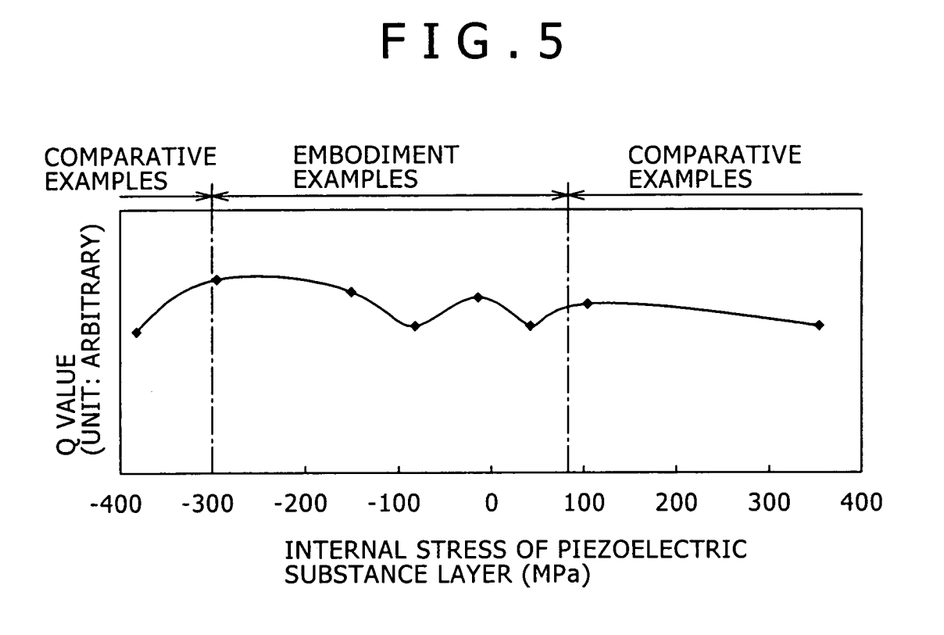
FIG. 5 is a graph showing relation between internal stresses and Q values of embodiment examples of the piezoelectric resonator element according to the present invention and comparative examples.

Further, the Q values of the FBARs according to the first, second, third, fifth, seventh, ninth, and tenth examples and the second, fourth, and seventh comparative examples described above were measured. Results of the measurement are shown in FIG. 5. The graph of FIG. 5 shows relation between the internal stress and the Q value with an axis of abscissas indicating the internal stress of the piezoelectric substance layer and an axis of ordinates indicating the Q value. As is shown in this graph, it is confirmed that the FBARs according to the examples have a high Q value, as with the FBARs according to the comparative examples. Incidentally, a decrease in the Q value at a high compressive stress exceeding −300 MPa is caused by the piezoelectric substance layer 14 of the vibrating part 18 being bent significantly due to the compressive stress.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described

TABLE 2

|  | First Comparative example | Second Comparative example | Third Comparative example | Fourth Comparative example | Fifth Comparative example | Sixth Comparative example | Seventh Comparative example |
|---|---|---|---|---|---|---|---|
| Internal Stress (MPa) | −450 | −400 | −350 | 100 | 150 | 200 | 350 | herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A piezoelectric resonator element comprising:
a lower electrode, a piezoelectric substance layer, and an upper electrode disposed in sequential order on a substrate with an air layer between said substrate and said lower electrode, and having the laminated structure of said lower electrode, said piezoelectric substance layer, and said upper electrode in at least a part of said piezoelectric resonator element,
wherein internal stress of said piezoelectric substance layer ranges from -300 MPa to 90 MPa.

2. The piezoelectric resonator element as claimed in claim 1, wherein said piezoelectric substance layer is formed by aluminium nitride oriented in a direction normal to said substrate.

3. The piezoelectric resonator element as claimed in claim 1, wherein said lower electrode encloses said air layer between said lower electrode and said substrate.

* * * * *